United States Patent
Brando et al.

(10) Patent No.: US 6,556,407 B2
(45) Date of Patent: Apr. 29, 2003

(54) METHOD AND DEVICE FOR DRIVING A POWER OUTPUT STAGE

(75) Inventors: Cyrille Brando, Regensburg (DE); Mark Elliott, Regensburg (DE); Johann Falter, Wenzenbach (DE)

(73) Assignee: Siemens Aktiengesellschaft, Munich (DE)

(*) Notice: Subject to any disclaimer, the term of this patent is extended or adjusted under 35 U.S.C. 154(b) by 122 days.

(21) Appl. No.: 09/873,648

(22) Filed: Jun. 4, 2001

(65) Prior Publication Data

US 2001/0040470 A1 Nov. 15, 2001

Related U.S. Application Data

(63) Continuation of application No. PCT/DE99/03816, filed on Dec. 1, 1999.

(30) Foreign Application Priority Data

Dec. 2, 1998 (DE) ........................................ 198 55 604

(51) Int. Cl.[7] .................................................. H02H 3/00
(52) U.S. Cl. ........................ 361/100; 361/18; 361/93.1; 361/115
(58) Field of Search ........................... 361/100, 90, 58, 361/115, 93.1, 18

(56) References Cited

U.S. PATENT DOCUMENTS 4,661,766 A  4/1987 Hoffman et al. ............ 323/287
5,623,221 A * 4/1997 Miyake ...................... 327/108

FOREIGN PATENT DOCUMENTS

| DE | 39 05 645 A1 | 8/1990 | .......... H03K/17/08 |
| DE | 40 12 382 A1 | 10/1991 | .......... H03K/17/08 |
| DE | 40 13 997 A1 | 11/1991 | .......... H03K/17/04 |
| DE | 41 31 783 C1 | 2/1993 | .......... H03K/17/16 |
| DE | 43 03 905 A1 | 8/1994 | .......... H03K/17/08 |
| DE | 195 27736 C1 | 11/1996 | .......... H03K/17/687 |
| EP | 0 508 171 A1 | 10/1992 | .......... H03K/17/16 |
| GB | 2 140 996 A | 12/1984 | .......... H03K/17/00 |
| GB | 2 318 467 A | 4/1998 | .......... H03K/17/16 |
| JP | 1 227522 | 9/1989 | .......... H03K/17/687 |

OTHER PUBLICATIONS

S. Igarashi et al.: "An Active Control Gate Drive Circuit for IGBTs to Realize Low–noise and Snubberless System", pp. 69–72, IEEE, 1997.

* cited by examiner

Primary Examiner—Stephen W. Jackson
(74) Attorney, Agent, or Firm—Laurence A. Greenberg; Werner H. Stemer; Gregory L. Mayback

(57) ABSTRACT

In order to drive it with compatible electromagnetic interference, a circuit breaker is charged with a high charging current until the drain current exceeds a current threshold. The circuit breaker is then charged further with a smaller charging current associated with the desired rate of rise, until the drain voltage falls below a predefined voltage threshold. The circuit breaker is then charged further with the high charging current for a predefined period. In order to close the circuit breaker, a nearly reverse sequence is followed.

3 Claims, 4 Drawing Sheets

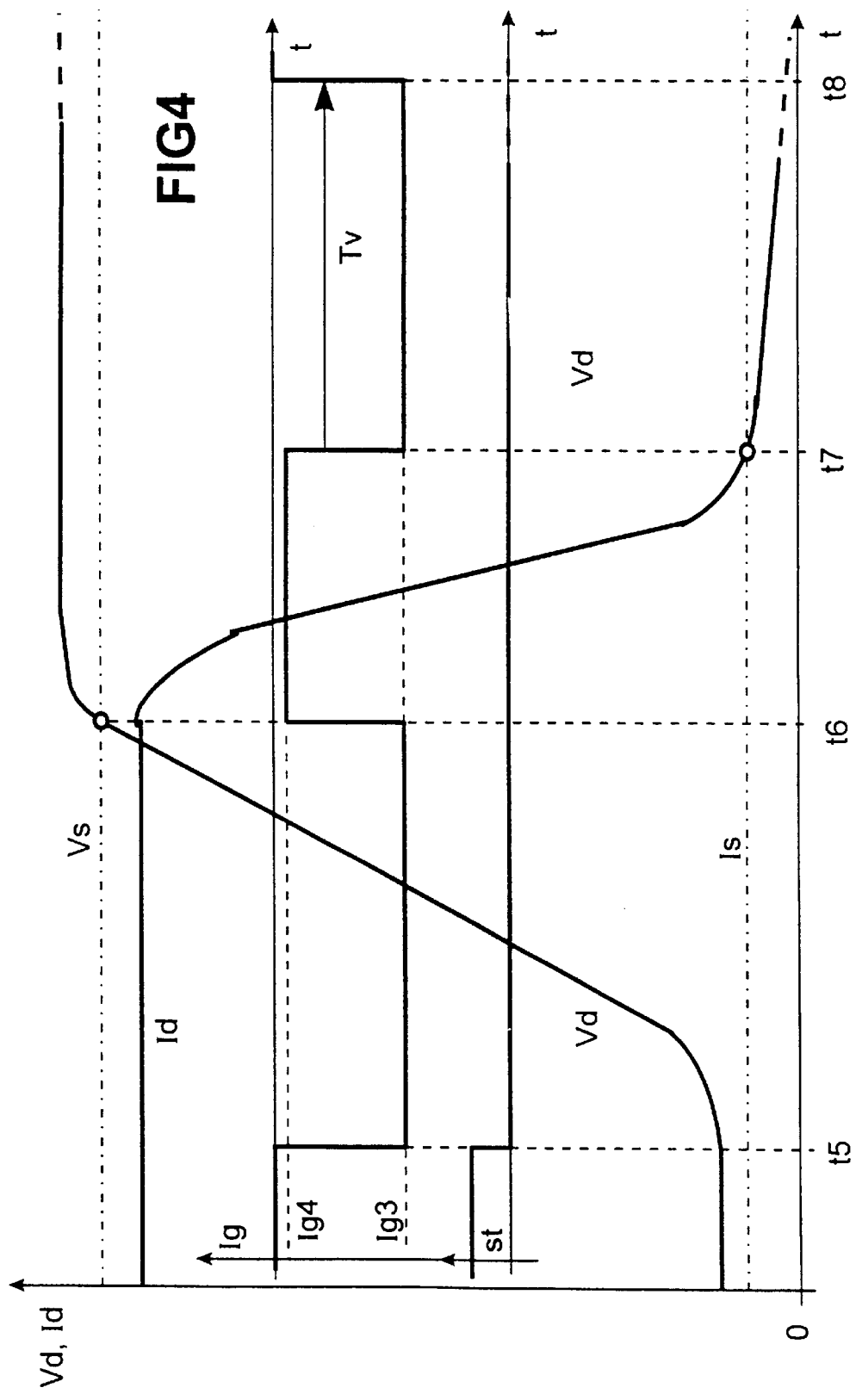

METHOD AND DEVICE FOR DRIVING A POWER OUTPUT STAGE

CROSS-REFERENCE TO RELATED APPLICATION

This application is a continuation of copending International Application No. PCT/DE99/03816, filed Dec. 1, 1999, which designated the United States.

BACKGROUND OF THE INVENTION

1. Field of the Invention

The invention relates to a method for driving a power output stage to switch a load connected in series with a MOSFET circuit breaker disposed between the terminals of a voltage source. The invention also relates to a device for implementing the method.

In order to drive inductive loads, power output stages with transistors, in particular MOSFET transistors, are used as the circuit breakers. When the transistors are switched off, the energy of the inductive load has to be dissipated either by zenering the output stage or through a freewheeling diode. In the case of loads with a high inductive energy, the freewheeling diode disposed across the load is used. One disadvantage with such output stages, in particular clocked output stages, is that they cause considerable electromagnetic interference.

One known cause for this is the rapid voltage change at the junction between the load and the circuit breaker. In the case of circuits with MOSFETs, for example, this cause is countered by high-resistance driving of the control terminal by a resistor.

A further cause for the electromagnetic interference that is caused is the rapid change, effected by the switching action, of the current flowing through the circuit breaker.

U.S. Pat. No. 4,661,766 discloses a power output stage for an inductive load with a freewheeling diode, in which the rate of change (current slew rate) of the current flowing through the circuit breaker or through the freewheeling branch is regulated to a predefined value. As a result, however, the switching operation, that is to say the transition from the off state to the on state, or vice versa, is very much delayed.

A similar circuit is disclosed in Published, British Patent Application GB 2 140 996 A, which discloses a method for the regulated switching of a load by use of control signals, in which a circuit breaker, from the start of a control signal, is charged with a charging current at a predefined, high rate of rise until the charging current exceeds a first threshold, then is charged with a charging current at a predefined, low rate of rise until the charging current reaches a second threshold, and is then charged further with a charging current at a predefined, high rate of rise. The rate of rise of the charging current is regulated as a function of the rate of rise of the load current. The discharging operation is carried out in the opposite sequence.

SUMMARY OF THE INVENTION

It is accordingly an object of the invention to provide a method and a device for driving a power output stage that overcome the above-mentioned disadvantages of the prior art methods and devices of this general type, in which an inductive load is driven by which the electromagnetic interference can be reduced and the switching delay (delay time) and the power loss can be kept small.

With the foregoing and other objects in view there is provided, in accordance with the invention, a method for driving power output stages. The method includes providing a power output stage for switching a load connected in series with a MOSFET circuit breaker disposed between terminals of a voltage source. The MOSFET circuit breaker is charged with a predefined high charging current until a drain current of the MOSFET circuit breaker exceeds a predefined current threshold from a start of a control signal. The MOSFET circuit breaker is charged with a predefined small charging current until a drain voltage of the MOSFET circuit breaker falls below a predefined voltage threshold, the predefined small charging current being smaller than the predefined high charging current. The MOSFET circuit breaker is charged further, for a predefined charging period, with the predefined high charging current. The MOSFET circuit breaker is charged with a predefined high discharge current until the drain voltage exceeds the predefined voltage threshold after an end of the control signal. The MOSFET circuit breaker is discharged with a predefined small discharge current until the drain current falls below the predefined current threshold, and then, for a predefined discharge period, the MOSFET circuit breaker is discharged with the predefined high discharge current. The predefined small discharge current is smaller than the predefined high discharge current.

The circuit according to the invention provides the advantage that the rate of change of current can be adjusted simply and precisely to be only so steep that no significant interference occurs, but at the same time the switching delay is prolonged only insignificantly.

In accordance with an added mode of the invention, there is the step of determining a maximum rate of rise of the drain current by a value of the predefined small charging current, and a rate of fall of the drain current is determined by a value of the predefined small discharge current.

With the foregoing and other objects in view there is provided, in accordance with the invention, a device containing a positive terminal for a supply voltage and a MOSFET circuit breaker having a gate terminal, a drain and a source. A first constant current source providing a high charging current is disposed between the positive terminal and the gate terminal of the MOSFET circuit breaker. A second constant current source providing a small charging current is disposed in parallel with the first constant current source. A negative terminal for the supply voltage is provided. A third constant current source providing a high discharge current is connected between the gate terminal of the MOSFET circuit breaker and the negative terminal for the supply voltage. A fourth constant current source providing a small discharge current is disposed in parallel with the third constant current source. A control circuit operated on the supply voltage and outputs switching signals to switch the first, the second, the third and the fourth constant current source on and off in dependence on: control signals received by the control circuit, a ratio of a drain voltage of the drain and a predefined voltage threshold, a ratio of a drain current flowing through the MOSFET circuit breaker and a predefined current threshold, and at least one predefined time period.

Other features which are considered as characteristic for the invention are set forth in the appended claims.

Although the invention is illustrated and described herein as embodied in a method and a device for driving a power output stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a graph showing a coarse of voltages and currents when switching a load on; and FIG. 4 is a graph relating to the course of the voltages and currents when switching the load off.

DESCRIPTION OF THE PREFERRED EMBODIMENTS

Figure 1:
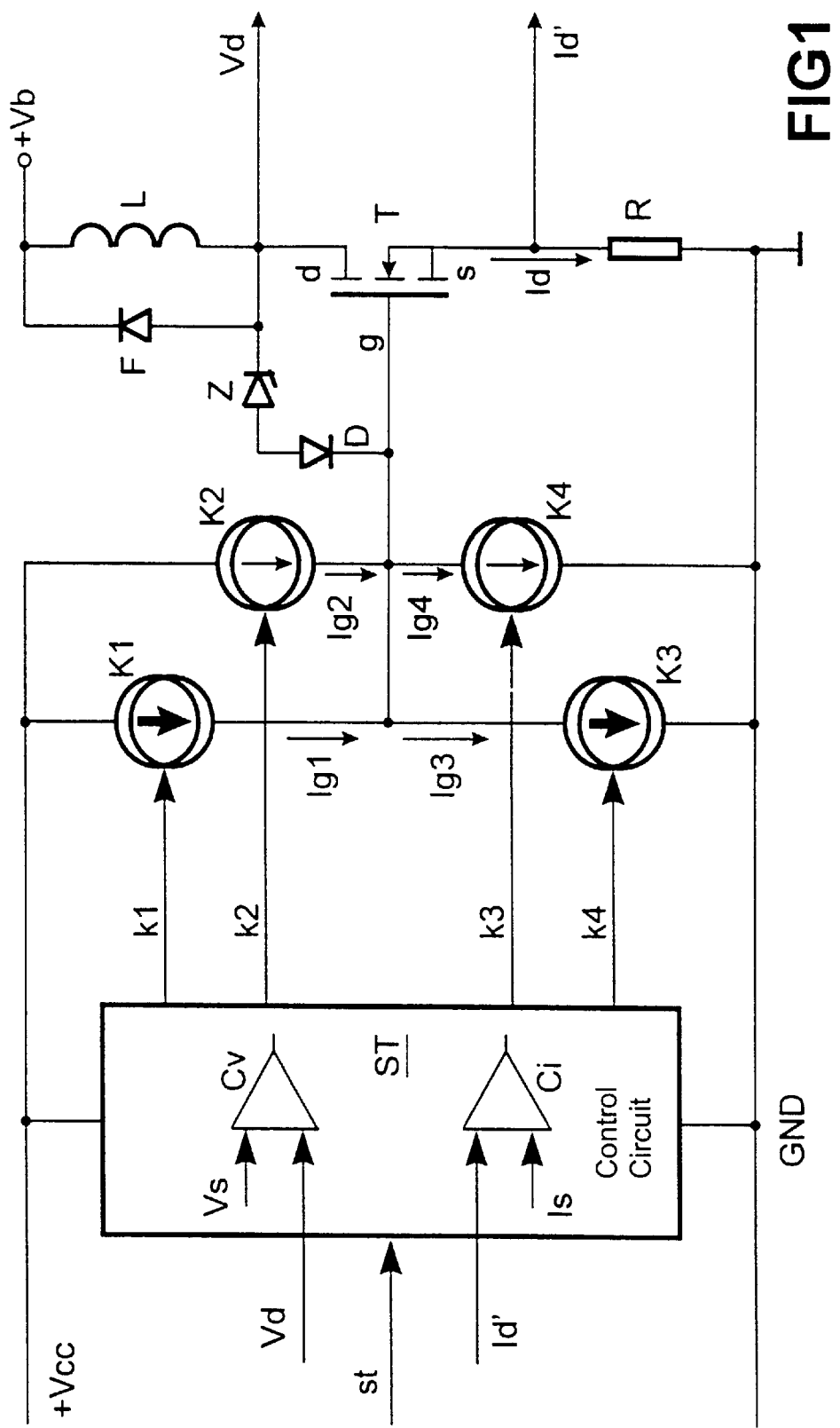
FIG. 1 is a circuit diagram of an exemplary embodiment of a power output stage according to the invention.

In all the figures of the drawing, sub-features and integral parts that correspond to one another bear the same reference symbol in each case. Referring now to the figures of the drawing in detail and first, particularly, to FIG. 1 thereof, there is shown a clocked power output stage employed in a motor vehicle and disposed in an integrated circuit in order to switch an inductive load L with a freewheeling diode F. The integrated power output stage can, for example, be disposed in a non-illustrated engine controller, from which it receives control signals st to switch the inductive load L on and off cyclically, for example a control valve for exhaust-gas recycling. Depending on the pulse duty factor set, the valve is driven open to a greater or lesser extent.

Connected to terminals +Vb and GND of a non-illustrated voltage source, for example the vehicle battery, is a series circuit containing the inductive load L and a circuit breaker T implemented by a MOSFET.

The load L is connected between a drain terminal d of the circuit breaker T and the positive pole +Vb of the voltage source. A source terminal s is connected to the negative pole GND through a measuring resistor R. Disposed in parallel with the load L is the freewheeling diode F that conducts current toward the positive terminal +Vb. In order to protect the circuit breaker T, there is disposed between the drain terminal d and a gate terminal g a series circuit of a Zener diode Z carrying current toward the drain terminal d and a diode D carrying current toward the gate terminal g.

The circuit breaker T is driven via a control circuit ST in which the control signals st, a comparison result of a drain voltage Vd with a predefined voltage threshold Vs and a comparison result of a current which flows through the circuit breaker T, referred to below as a drain current Id, with a predefined current threshold Is are converted into drive signals k1 to k4 received by constant current sources K1 to K4. The voltage threshold Vs is chosen such that it lies somewhat below a battery voltage Vb (for example Vb=14V, Vs=13V), and the current threshold Is is intended to be about one tenth to one twentieth of a drain current nominal value Id (for example Id=2A, Is=100 mA).

In order to carry out the voltage and current comparison, two comparators Cv and Ci are provided in the control circuit ST. To which comparators, in addition to the predefined thresholds Vs and Is, the drain voltage Vd and the drain current Id (as the voltage value Id' dropped across the measuring resistor R) are supplied.

When they are switched on, constant current sources K1 to K4 generate constant charging or discharging currents Ig1 to Ig4, with which the gate of the circuit breaker T is charged or discharged.

The control circuit ST and the constant current sources K1 to K4 are operated with a supply voltage Vcc which can be tapped off at the terminals +Vcc and GND. The parallel-connected constant current sources K1 and K2 are disposed between the positive terminal +Vcc and the gate terminal g and, when they are switched on, impress charging currents Ig1 and Ig2 which are directed toward the gate terminal g. The likewise parallel-connected constant current sources K3 and K4 are disposed between the gate terminal g and the negative terminal GND and, when switched on, impress discharge currents Ig3 and Ig4 directed away from the gate terminal g.

The constant current sources K1 and K3 generate currents Ig1, Ig3 (for example 2 mA) which are higher approximately by the factor 10 than the constant current sources K2 and K4 (Ig2, Ig4), which, depending on the desired rate of rise or fall of the drain current (current slew rate) in this case generate 0.2 mA, for example, which is indicated in FIG. 1 by respectively thick and thin arrows pointing in the respective current direction in the constant current sources K1 to K4.

Figure 2:
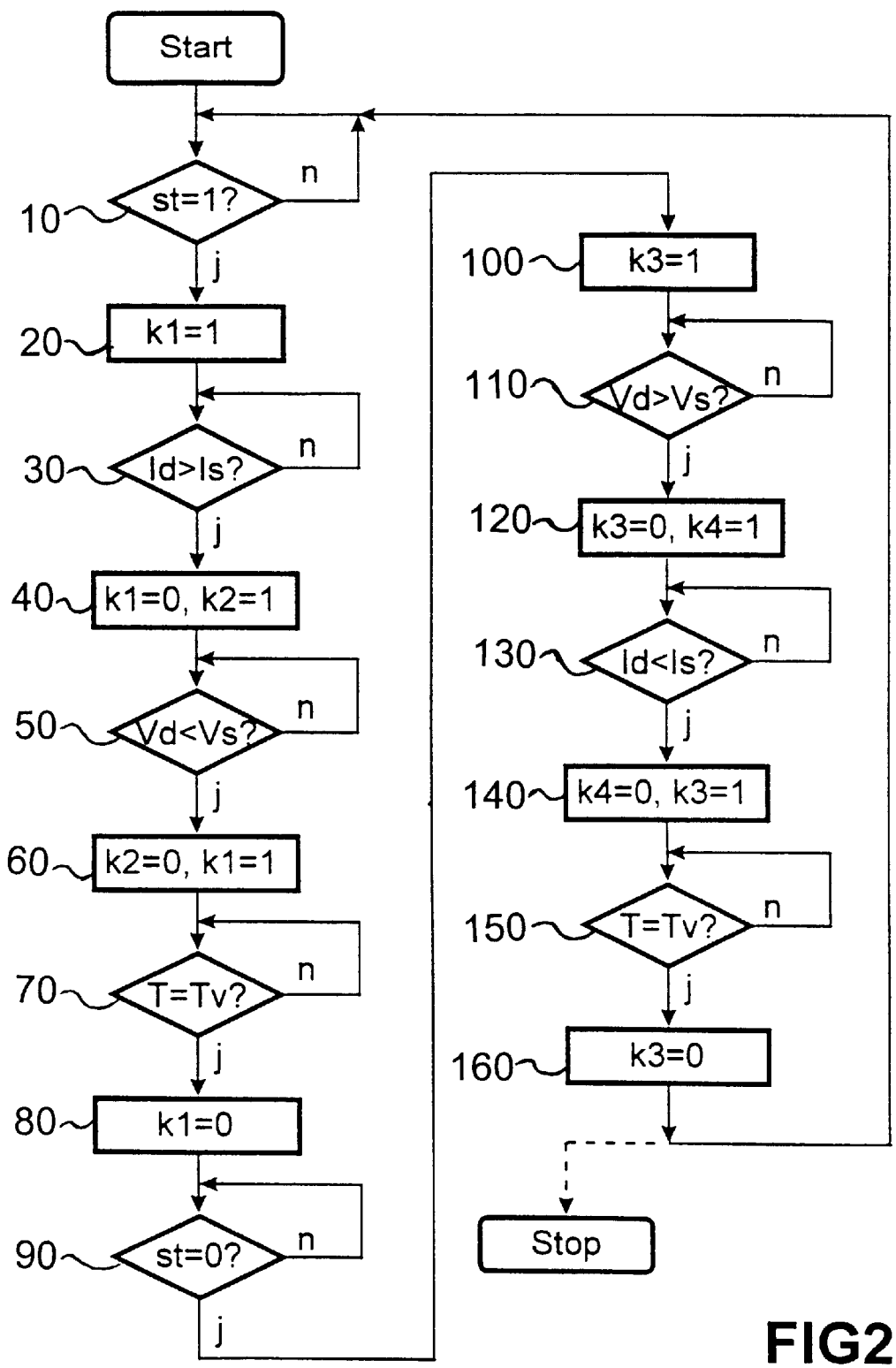
FIG. 2 is a flow diagram relating to a method according to the invention.

In the following text, the method of switching the inductive load by the power output stage will be described using FIGS. 1 to 4. The flow diagram of FIG. 2 illustrates the method sequence for the clocked, progressive switching of the load on and off. The individual method steps designated by reference numerals will be referred to in the following description.

Figure 3:
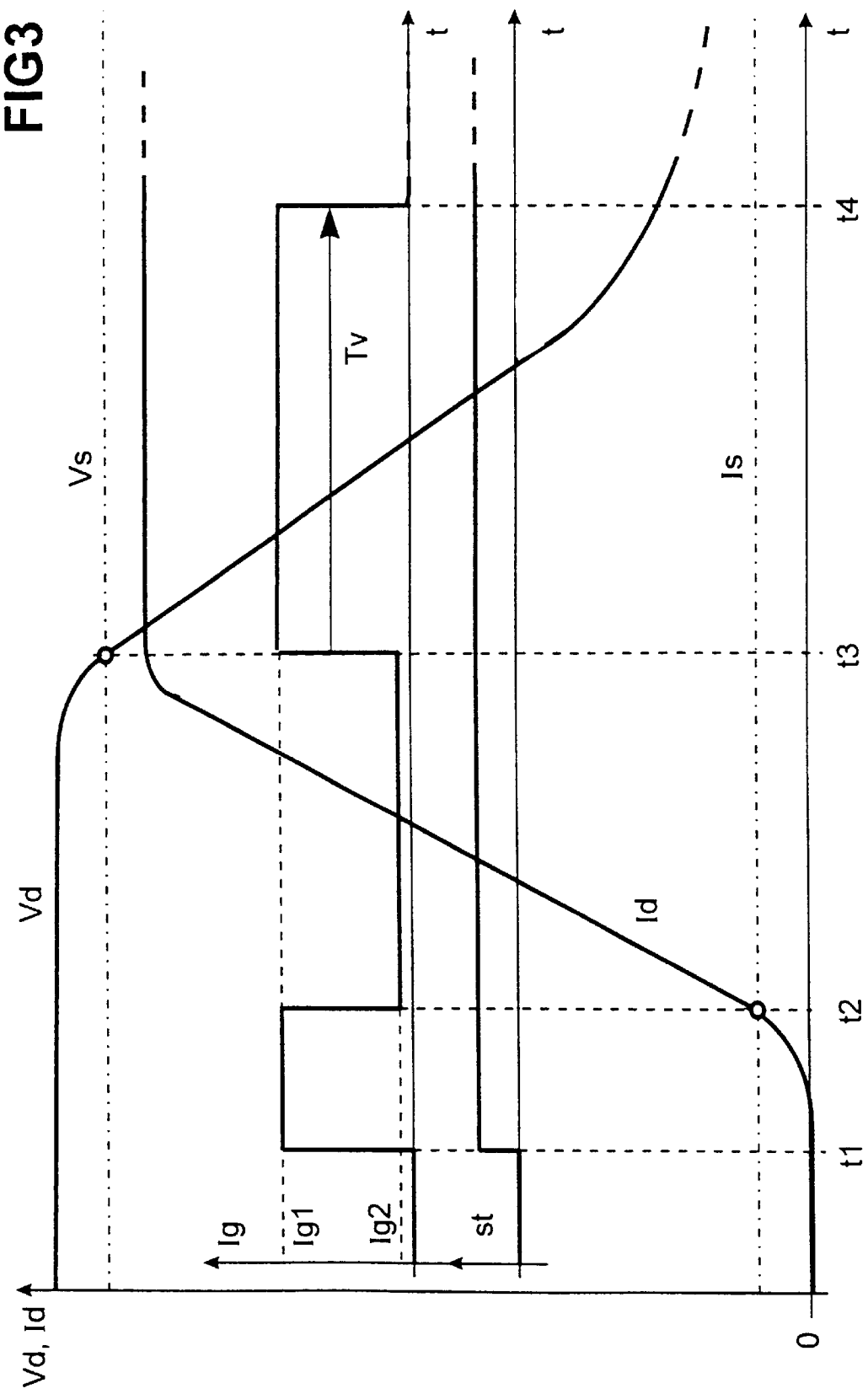

FIG. 3 shows the current and voltage courses when switching the load L on, and FIG. 4 shows the current and voltage courses when switching the load off. In each case the control signal st and the charging current are plotted (with a positive sign in FIG. 3), the discharge current being plotted (with a negative sign in FIG. 4) and the resulting courses of he drain voltage Vd on the drain terminal d and of the drain current Id are plotted. In addition, the voltage threshold Vs and the current threshold Is are shown.

FIGS. 3 and 4 show the currents and voltages during clocked operation, that is to say not when the load is first switched on at the start of operation.

When the control signal st=1 appears at a time t1 in order to switch the load L on, see step 10 FIG. 2, the control circuit ST outputs a signal k1 to turn the constant current source K1 on, step 20. As a result of which a high charging current Ig1 flows toward the gate of the circuit breaker T, which is charged quickly. As soon as, at a time t2, the drain current Id, which then rises, exceeds the threshold Is, see step 30, the constant current source K1 is switched off and, in its place, the constant current source K2 is switched on by a signal k2, see step 40, and then for its part charges the gate with a low charging current Ig2.

The drain current Id then rises at the desired rate of rise to a desired value, as a result of which the drain voltage Vd falls and the circuit breaker T changes into the on state. When the circuit breaker T was in the off state, because of the freewheeling current which flowed, the drain voltage Vd had a value which was higher than the battery voltage +Vb by the voltage across the freewheeling diode F.

As soon as the drain voltage Vd, at a time t3, falls below the voltage threshold Vs, step 50, the constant current source K2 is switched off and the constant current source K1 is switched on once more for a predefined period Tv, steps 60, 70. As a result of this action, the circuit breaker T is driven on fully with the high charging current Ig1 and its drain-source resistance is minimized, as a result of which, when the circuit breaker T is on, there is a very small voltage drop.

After the predefined period Tv has elapsed, at a time t4, the constant current source K1 is switched off again; the load is now switched on completely, step 80. This state is maintained until the control signal st falls to 0 at the time t5 (FIG. 4) step 90, which results in that the load L is to be switched off.

At the end of the control signal, st=0, the constant current source K3 is switched on, step 100, as a result of which a high discharge current Ig3 flows away from the gate of the circuit breaker T. The drain voltage Vd therefore rises. When, at a time t6, it exceeds the voltage threshold Vs, step 110, the constant current source K3 is switched off and the constant current source K4 is switched on, step 120, as a result of which the drain current Id becomes smaller at the desired rate of current drop associated with the discharge current Ig4, and the freewheeling branch accepts the current. The drain voltage Vd rises again to a value that is higher than the battery voltage +Vb by the voltage across the freewheeling diode F.

As soon as the drain current falls below the current threshold Is, step 130, the constant current source K4 is switched off and the constant current source K3 is switched on again for the predefined period Tv, step 140, in order now to clear the gate quickly with a high discharge current Ig3 and to turn the circuit breaker T off. After the expiry of the predefined period Tv, step 150, the constant current source K3 is switched off, step 160, as a result of which the initial state is reached again. It can then be clocked further, back to step 10, or the driving of the load can be terminated.

The alternating charging and discharging of the circuit breaker T with the high and low charging and discharging currents results in that the switching-on and switching-off delay times remain small (which, in the event of driving only with a small charging or discharge current, associated with the desired rate of rise and fall, would last about ten to twenty times as long) and, nevertheless no or only very little electromagnetic interference occurs, since the rates of rise and fall of the drain current Id are limited to predefined values.

In this exemplary embodiment, the magnitudes |Ig1|=|Ig3|, |Ig2|=|Ig4| and |Tv| (during charging)=|Tv| (during discharging) have been selected to be equal in each case. However, the magnitudes can also be selected to be different, matching the requirements.

We claim:

1. A method for driving power output stages, which comprises the steps of:
   providing a power output stage for switching a load connected in series with a MOSFET circuit breaker disposed between terminals of a voltage source;
   charging the MOSFET circuit breaker with a predefined high charging current until a drain current of the MOSFET circuit breaker exceeds a predefined current threshold from a start of a control signal;
   charging the MOSFET circuit breaker with a predefined small charging current until a drain voltage of the MOSFET circuit breaker falls below a predefined voltage threshold, the predefined small charging current being smaller than the predefined high charging current;
   charging the MOSFET circuit breaker further, for a predefined charging period, with the predefined high charging current;
   discharging the MOSFET circuit breaker with a predefined high discharge current until the drain voltage exceeds the predefined voltage threshold after an end of the control signal; and
   discharging the MOSFET circuit breaker with a predefined small discharge current until the drain current falls below the predefined current threshold, and then, for a predefined discharge period, the MOSFET circuit breaker being discharged with the predefined high discharge current, the predefined small discharge current being smaller than the predefined high discharge current.

2. The method according to claim 1, which comprises determining a maximum rate of rise of the drain current by a value of the predefined small charging current, and a rate of fall of the drain current is determined by a value of the predefined small discharge current.

3. A device, comprising:
   a positive terminal for a supply voltage;
   a MOSFET circuit breaker having a gate terminal, a drain and a source;
   a first constant current source providing a high charging current disposed between said positive terminal and said gate terminal of said MOSFET circuit breaker;
   a second constant current source providing a small charging current disposed in parallel with said first constant current source;
   a negative terminal for the supply voltage;
   a third constant current source providing a high discharge current connected between said gate terminal of said MOSFET circuit breaker and said negative terminal for the supply voltage;
   a fourth constant current source providing a small discharge current disposed in parallel with said third constant current source; and
   a control circuit operated on the supply voltage and outputting switching signals-to switch said first, said second, said third and said fourth constant current source on and off in dependence on:
   control signals received by said control circuit;
   a ratio of a drain voltage of said drain and a predefined voltage threshold;
   a ratio of a drain current flowing through said MOSFET circuit breaker and a predefined current threshold; and
   at least one predefined time period.

* * * * *